United States Patent
Hong et al.

(10) Patent No.: US 10,878,920 B2
(45) Date of Patent: Dec. 29, 2020

(54) MEMORY CONTROLLER AND MEMORY SYSTEM HAVING THE SAME

(71) Applicant: SK hynix Inc., Gyeonggi-do (KR)

(72) Inventors: Jiman Hong, Gyeonggi-do (KR); Tae Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 61 days.

(21) Appl. No.: 16/238,688

(22) Filed: Jan. 3, 2019

(65) Prior Publication Data
US 2019/0295659 A1   Sep. 26, 2019

(30) Foreign Application Priority Data

Mar. 21, 2018  (KR) .......................... 10-2018-0032853
Jun. 14, 2018  (KR) .......................... 10-2018-0068031

(51) Int. Cl.
*G11C 16/26* (2006.01)
*G06F 11/10* (2006.01)
*G11C 29/52* (2006.01)
*G11C 11/56* (2006.01)
*G11C 16/04* (2006.01)

(52) U.S. Cl.
CPC .......... *G11C 16/26* (2013.01); *G06F 11/1068* (2013.01); *G11C 29/52* (2013.01); *G11C 11/5671* (2013.01); *G11C 16/0483* (2013.01)

(58) Field of Classification Search
CPC ..... G11C 16/26; G11C 29/52; G11C 16/0483; G11C 11/5671; G11C 29/021; G11C 29/028; G06F 11/1068; G06F 11/1012; G06F 11/1048
See application file for complete search history.

(56) References Cited

U.S. PATENT DOCUMENTS

| 2010/0214853 A1* | 8/2010 | Kang ............... G11C 5/147 365/189.07 |
| 2017/0308432 A1* | 10/2017 | Hsiao ............... G11C 16/26 |
| 2018/0061494 A1* | 3/2018 | Hwang ............ G06F 11/1068 |

(Continued)

FOREIGN PATENT DOCUMENTS

| KR | 1200125 | 1/2012 |
| KR | 1020150090244 | 8/2015 |
| KR | 101586046 | 1/2016 |

OTHER PUBLICATIONS

L. Zuolo, C. Zambelli, R. Micheloni and P. Olivo, "Solid-State Drives: Memory Driven Design Methodologies for Optimal Performance," in Proceedings of the IEEE, vol. 105, No. 9, pp. 1589-1608, Sep. 2017. (Year: 2017).*

(Continued)

*Primary Examiner* — Cynthia Britt
(74) *Attorney, Agent, or Firm* — IP & T Group LLP

(57) ABSTRACT

The memory controller includes a command generator generating first read commands respectively corresponding to each of a plurality of read voltages having different levels and transferring the first read commands to a memory device so that first read operation is performed plural times on a plurality of memory cells for each of the read voltages, and an inverted cell counter determining inverted cells showing different bit values during the first read operation performed plural times for each read voltage on the basis of read result data received from the memory device.

19 Claims, 14 Drawing Sheets

(56) References Cited

U.S. PATENT DOCUMENTS

2018/0286495 A1* 10/2018 Oh ................. G11C 11/5642
2019/0354313 A1* 11/2019 Sheperek ............ G06F 3/0604

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017. (Year: 2017).*
C. A. Aslam, Y. L. Guan and K. Cai, "Read and Write Voltage Signal Optimization for Multi-Level-Cell (MLC) NAND Flash Memory," in IEEE Transactions on Communications, vol. 64, No. 4, pp. 1613-1623, Apr. 2016. (Year: 2016).*

* cited by examiner

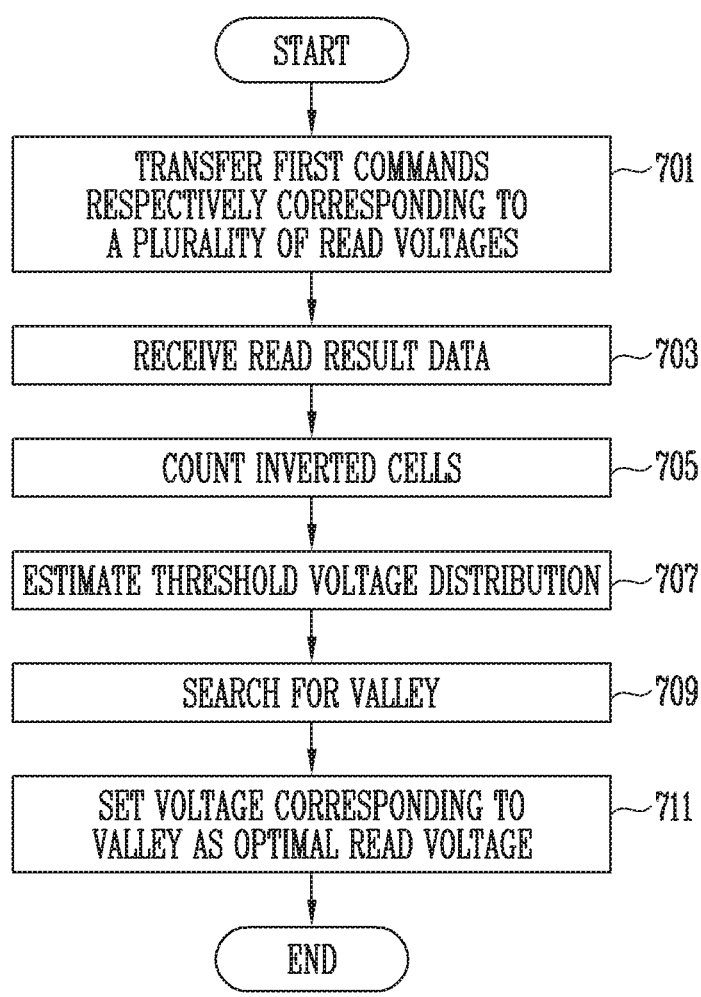

FIG. 8A
FIG. 8B
FIG. 9
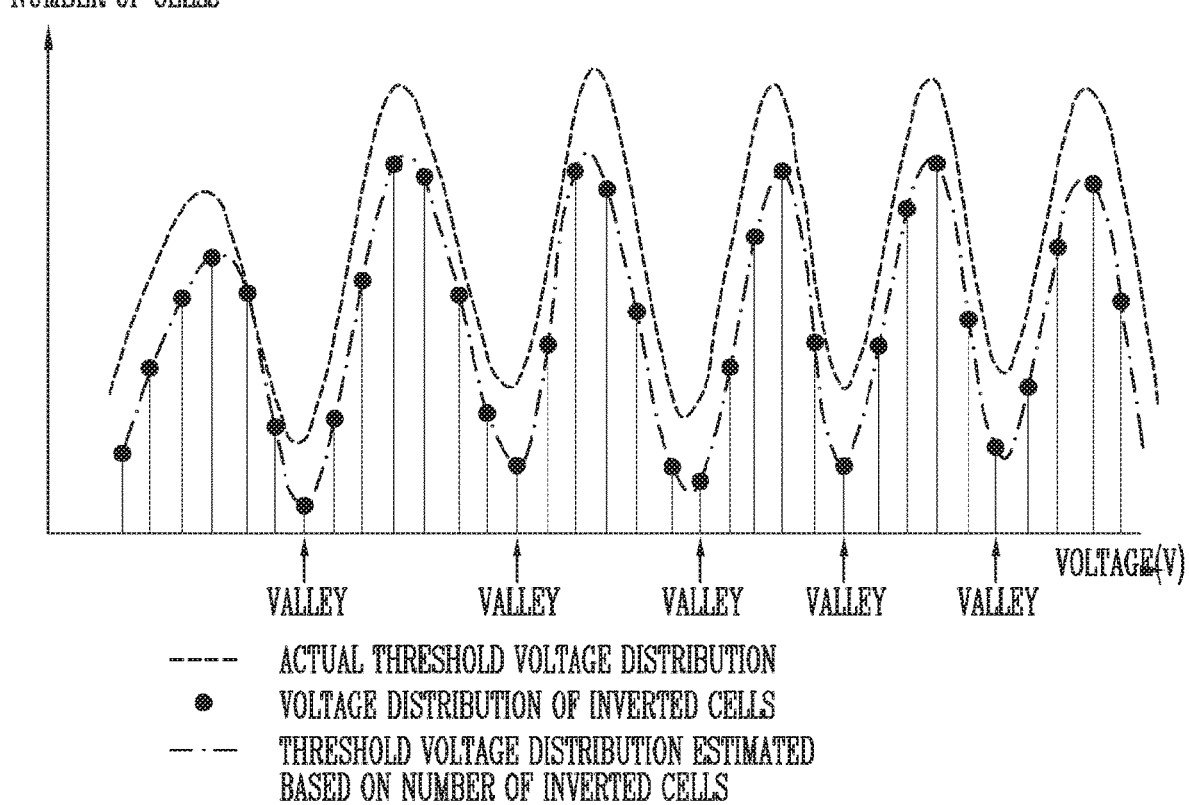

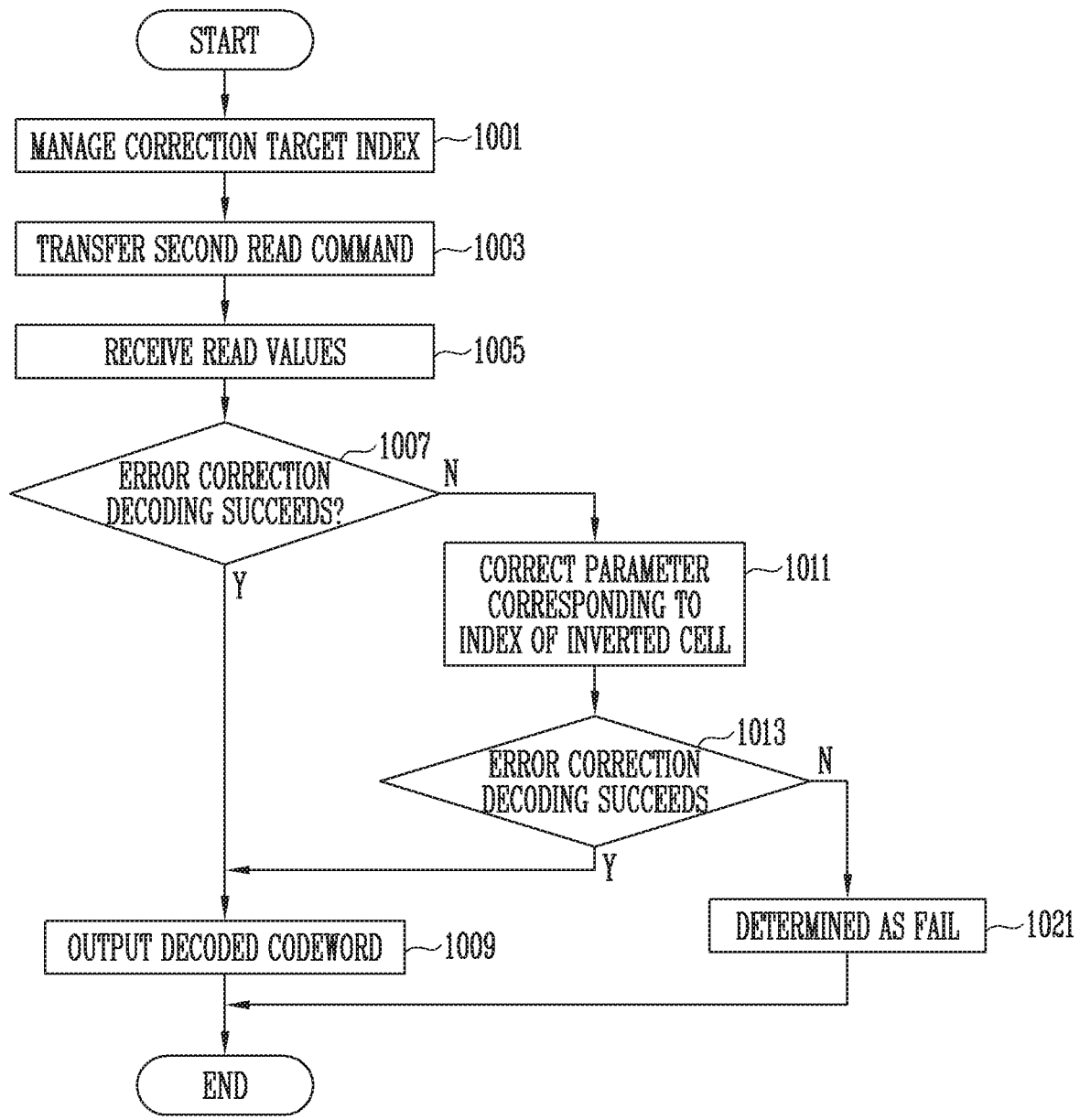

MEMORY CONTROLLER AND MEMORY SYSTEM HAVING THE SAME

CROSS-REFERENCE TO RELATED APPLICATIONS

The present application claims priority under 35 U.S.C. § 119(a) to Korean patent application numbers 10-2018-0032853 and 10-2018-0068031, filed on Mar. 21, 2018 and Jun. 14, 2018, respectively, the entire disclosures of which are incorporated herein by reference in its entirety.

BACKGROUND

1. Field of Invention

Various embodiments of the invention relate to a memory controller and a memory system having the same, and more particularly, to a memory controller capable of counting inverted cells through a plurality of read operations and a memory system having the memory controller.

2. Description of Related Art

A memory system may include a storage device and a memory controller.

The storage device may include a plurality of memory devices. The memory devices may store data and output the stored data. Any of the memory devices may be a volatile memory device that does not retain stored data when not powered, or a non-volatile memory device that retains the stored data even when no power is supplied.

The memory controller may control data communication between a host and the storage device.

The host may communicate with the memory devices by using an interface protocol such as Peripheral Component Interconnect-Express (PCI-e), Advanced Technology Attachment (ATA), Serial ATA (SATA), Parallel ATA (PATA), or serial attached SCSI (SAS).

SUMMARY

Various embodiments are directed to a memory controller for determining an optimal read voltage and a memory system having the memory controller.

In accordance with an embodiment, a memory controller may include a command generator generating first read commands respectively corresponding to each of a plurality of read voltages having different levels and transferring the first read commands to a memory device so that a first read operation is performed plural times on a plurality of memory cells for each of the read voltages, and an inverted cell counter determining inverted cells showing different bit values during the first read operation performed plural times for each read voltage on the basis of read result data received from the memory device.

In accordance with an embodiment, a memory controller may include a command generator generating first read commands for a plurality of read voltages having different levels respectively, and transferring the first read commands to a memory device so that a first read operation is performed plural times on a plurality of memory cells for each of the read voltages, an inverted cell counter determining inverted cells showing different bit values during the first read operation performed plural times for each read voltage on the basis of read result data received from the memory device, and an optimal read voltage determiner estimating a threshold voltage distribution of the memory cells from a voltage distribution of inverted cells for each of the plurality of read voltages.

In accordance with an embodiment, a memory controller may include a command generator generating first read commands for a plurality of read voltages having different levels respectively, and transferring the first read commands to a memory device so that a first read operation is performed plural times on a plurality of memory cells for each of the read voltages, an inverted cell counter determining inverted cells showing different bit values during the first read operation performed plural times for each read voltage on the basis of read result data received from the memory device, an optimal read voltage determiner estimating a threshold voltage distribution of the memory cells from a voltage distribution of inverted cells for each of the plurality of read voltages and setting, among the plurality of read voltages, a read voltage corresponding to a valley of the estimated threshold voltage distribution as an optimal read voltage, a correction target index manager storing an index of the inverted cell corresponding to the optimal read voltage on the basis of read result data corresponding to the optimal read voltage, among read result data corresponding to the first read operations, and an error correction code (ECC) circuit performing error correction decoding on read values, which correspond to a codeword, received from the memory device as a result of a second read operation corresponding to the optimal read voltage, and retrying the error correction decoding by changing a parameter corresponding to the inverted cell by referring the stored index when the error correction decoding fails.

In accordance with an embodiment, a memory system may include a memory device performing read operations on a plurality of memory cells, and a memory controller suitable for generating and transferring two read commands for each of a plurality of read voltages having different levels to the memory device so that two read operations are performed on the plurality of memory cells for each of the plurality of read voltages, receiving read data corresponding to results of the two read operations performed on each of the plurality of memory cells from the memory device, checking whether inverted cells having inverted read data exist among the plurality of memory cells by comparing the read data, and counting checked inverted cells for each of the read voltages.

In accordance with an embodiment, an operating method of a memory system may include performing plural times a preliminary read operation on memory cells for each of different read voltages, selecting one or more optimal read voltages among the read voltages based on a number of inverted read values detected for each of the read voltages, and performing a primary read operation on the memory cells with the optimal read voltages.

The operating method of a memory system may further include changing, when error correction decoding fails during the primary read operation, one or more parameters of error correction decoding to retry the error correction decoding, wherein the parameters correspond to the inverted read values.

BRIEF DESCRIPTION OF THE DRAWINGS

FIG. 7 is a flowchart illustrating a method of operating a memory controller, such as that shown in FIGS. 1 and 2;

FIG. 8A is a diagram illustrating read result data in accordance with an embodiment;

FIG. 8B is a diagram illustrating read result data in accordance with an embodiment;

FIG. 9 is a diagram illustrating an exemplary voltage distribution of inverted cells and an exemplary threshold voltage distribution of memory cells;

FIG. 10 is a flowchart illustrating a method of operating a memory controller, such as that shown in FIGS. 1 and 2, in accordance with an embodiment;

DETAILED DESCRIPTION

Various embodiments will now be described more fully with reference to the accompanying drawings. However, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. Throughout the specification, reference to "an embodiment," "another embodiment" or the like is not necessarily to only one embodiment, and different references to any such phrase are not necessarily to the same embodiment(s).

It will be understood that when an element is referred to as being "coupled" or "connected" to a certain element, it may be directly coupled or connected to the certain element, or it may be indirectly coupled or connected to the certain element with intervening elements being present therebetween. Communication between two elements, whether directly or indirectly connected/coupled, may be wired or wireless, unless the context indicates otherwise. In the specification, when an element is referred to as "comprising" or "including" a component, such phrase does not exclude one or more other components but may further include such other component(s), unless the context indicates otherwise.

Various embodiments of the invention will be described now in detail with reference to the accompanying drawings.

Figure 1:
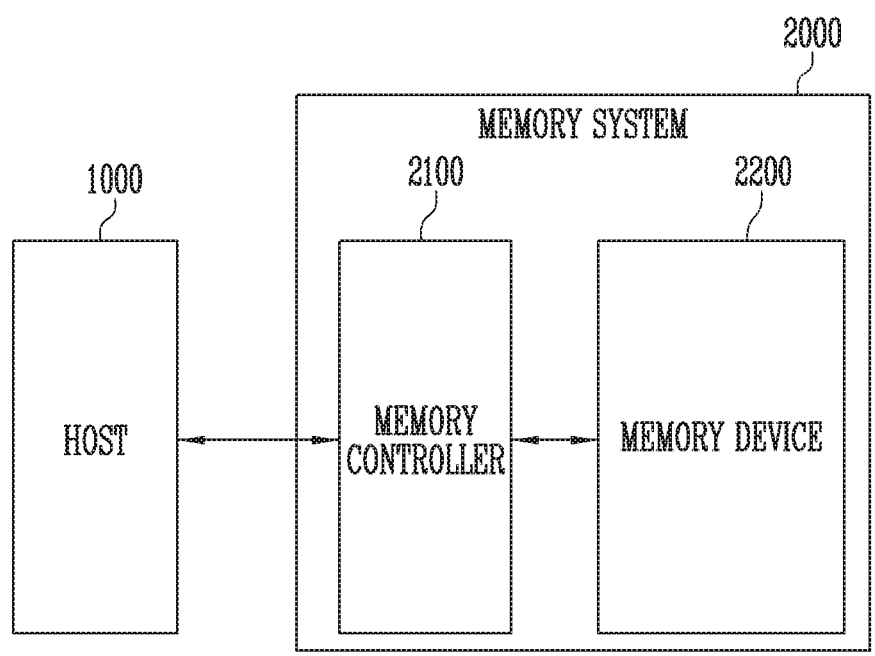
FIG. 1 is a diagram illustrating a memory system in accordance with an embodiment.

FIG. 1 is a diagram illustrating a memory system 2000 in accordance with an embodiment.

Referring to FIG. 1, the memory system 2000 may include a memory device 2200 storing data and a memory controller 2100 controlling the memory device 2200 in response to control of a host 1000.

The host 1000 may communicate with the memory system 2000 by using an interface protocol such as Peripheral Component Interconnect-Express (PCI-E), Advanced Technology Attachment (ATA), Serial ATA (SATA), Parallel ATA (PATA), or serial attached SCSI (SAS). However, interface protocols provided for the purpose of data communication between the host 1000 and the memory system 2000 may not be limited to the above examples. Any of various other interface protocols such as a Universal Serial Bus (USB), a Multi-Media Card (MMC) an Enhanced Small Disk Interface (ESDI), or Integrated Drive Electronics (IDE) may be used instead.

The memory controller 2100 may control the general operations of the memory system 2000 and control data exchange between the host 1000 and the memory device 2200. During a program operation, the memory controller 2100 may transfer commands, addresses, and data to the memory device 2200. During a read operation, the memory controller 2100 may transfer a command and an address to the memory device 2200.

The memory controller 2100 may control the memory device 2200 so that a read operation may be performed on a plurality of memory cells included in the memory device 2200. The read operation may include a first read operation and a second read operation.

The first read operation may be performed for each of a plurality of read voltages having different voltage levels. The first read operation may be performed a plurality of times for each of the different read voltages. In other words, when the memory controller 2100 controls the memory device 2200 to perform a read operation on memory cells by using read voltages having different voltage levels, the memory controller 2100 may control the memory device 2200 to perform the first read operation a plurality of times for each of the different read voltages. That is, the memory controller 2100 may control the memory device 2200 to perform the first read operation in this manner by changing read voltages. For example, the memory controller 2100 may control the memory device 2200 to perform the first read operation a plurality of times for each of different read voltages from 0 V to 10 V in increments of 10 mV. In accordance with an embodiment, the first read operation may be performed twice for each of the different read voltages. Memory cells subject to the first read operation may form a single page. In other words, the first read operation may be performed on a single page. According an embodiment, the first read operation may be performed three or more times for each of the different read voltages.

The memory controller 2100 may transfer a first read command corresponding to each of the plurality of read voltages to the memory device 2200. The first read command may be one of an A type first read command or a B type first read command. In accordance with an embodiment, the A type first read command may instruct the memory device 2200 to perform the first read operation once using one of the plurality of read voltages. In accordance with an embodiment, the B type first read command may instruct the memory device 2200 to perform the first read operation a plurality of times (for example, twice) using one of the plurality of read voltages.

The memory controller 2100 may receive read result data corresponding to the first read operations from the memory device 2200.

In accordance with an embodiment, the read result data may be read data respectively corresponding to a plurality of first read operations. For example, when the first read operation is performed twice on a single page for each of the plurality of read voltages, read data corresponding to the single page may be received twice for each of the plurality of read voltages. In other words, when the first read operation is performed twice on the single page using the same read voltage, read data from the single page may be received twice for that same read voltage.

In accordance with an embodiment, read result data may refer to data corresponding to a result of comparing respective read data corresponding to the first read operation performed plural times for a single read voltage. The read result data may indicate whether the read data from each of the memory cells is inverted or not. For example, when the first read operation is performed twice on a single page for each of the plurality of read voltages, read data corresponding to the single page may be received once in the first read operation performed twice for each of the plurality of read voltages. In other words, when the first read operation is performed twice on the single page for a single read voltage, read result data corresponding to the single page may be received once as a result of the first read operation performed twice for the single read voltage.

The memory controller 2100 may determine e.g., count, inverted cells corresponding to each of the plurality of read voltages on the basis of the read result data received from the memory device 2200. The inverted cells for each of the plurality of read voltages may refer to cells in which read data are inverted during the first read operation performed plural times for each read voltage. In other words, the inverted cells may refer to cells from which different bits are read out during the first read operation performed plural times for a single read voltage.

In accordance with an embodiment, when the read result data received from the memory device 2200 may be respective read data corresponding to the first read operation performed plural times for each read voltage, the memory controller 2100 may check whether an inverted cell exists within the read page by comparing read data corresponding to the same read voltage, and may count the number of inverted cells. The memory controller 2100 may store indexes of the inverted cells. An index of an inverted cell may correspond to a column address of the inverted cell. In other words, the memory controller 2100 may store location information about the inverted cells among the plurality of memory cells in the read page.

In accordance with an embodiment, when the read result data received from the memory device 2200 indicates whether the read data corresponding to each memory cell within the read page is inverted or not, the memory controller 2100 may determine or count the inverted cells on the basis of the read result data. For example, the read result data may be received in the form of a bit sequence having a length corresponding to the read page, and each bit included in the bit sequence may indicate whether a memory cell located at a location corresponding to the bit is inverted or not.

For example, an nth bit included in the bit sequence may indicate whether a memory cell corresponding to the nth index is inverted or not, where n is a natural number. For example, when the nth bit has a specific value, e.g., 1, it may mean that the memory cell corresponding to the nth index is an inverted cell, and when the nth bit has a specific value, e.g., 0, it may mean that the memory cell corresponding to the nth index may be a non-inverted cell. The memory controller 2100 may determine inverted cells by counting how many bits having the value of 1 are included in the bit sequence. The memory controller 2100 may store the indexes of the inverted cells. As described above, the indexes of the inverted cells may correspond to column addresses of the inverted cells.

The memory controller 2100 may estimate a threshold voltage distribution of memory cells according to the number of inverted cells corresponding to each of the plurality of read voltages. Read data may vary due to random telegraph noise (RTN) during each read operation. RTN may refer to noise which affects a variation in a threshold voltage during a read operation. Therefore, the number of memory cells whose read data vary each time a read operation is performed, i.e., a voltage distribution of the inverted cells, may be proportional to a threshold voltage distribution of the memory cells.

For example, when there are a thousand memory cells each having a set or predetermined threshold voltage, there may be a hundred cells whose values are inverted by RTN during read operations corresponding to the predetermined threshold voltage. In another example, when there are a hundred memory cells each having a set or predetermined threshold voltage, there may be ten cells whose values are inverted by RTN during read operations. Therefore, in accordance with an embodiment, the voltage distribution of the inverted cells may be estimated as a threshold voltage distribution of the memory cells.

The memory controller 2100 may perform a valley search operation on the basis of the estimated threshold voltage distribution or the voltage distribution of the inverted cells. For example, when memory cells are n-bit multi-level cells (MLC), each of the memory cells may have an erase state or one of $2^n-1$ program states. In this example, the memory controller 2100 may find $2^n-1$ valleys in the estimated threshold voltage distribution. Each of the valleys may be formed by overlap between two adjacent states and may correspond to a read voltage at which the number of the inverted cells is the smallest between the two adjacent states of the estimated threshold voltage distribution.

The memory controller 2100 may set the read voltage corresponding to the valley in the estimated threshold voltage distribution as an optimal read voltage. For example, when memory cells are n-bit multi-level cells (MLC), $2^n-1$ optimal read voltages corresponding to $2^n-1$ valleys, respectively, may be set. For example, the memory controller 2100 may set a read voltage corresponding to a valley between a first program state and a second program state as an optimal read voltage for differentiating the first program state and the second program state from each other.

The memory controller 2100 may store and manage the index of the inverted cell corresponding to the optimal read voltage. In other words, the memory controller 2100 may store and manage the index of the inverted cell at the read voltage corresponding to the optimal read voltage among the plurality of read voltages used in the first read operation. The index of the inverted cell corresponding to the optimal read voltage may be used to correct a parameter for improving error correction decoding performance. For convenience of explanation, the index of the inverted cell corresponding to the optimal read voltage among the plurality of read voltages used in the first read operation may be referred to as a "correction target index".

The second read operation may be performed using the optimal read voltage. In other words, the memory controller 2100 may control the memory device 2200 to perform the second read operation on a plurality of memory cells using the optimal read voltages obtained through the first read operation performed plural times for each of the plurality of different read voltages. The memory controller 2100 may generate a second read command instructing to perform the second read operation corresponding to the optimal read voltage and transfer the second read command to the memory device 2200.

The memory controller 2100 may receive read values, which correspond to a codeword, in corresponding to the second read command from the memory device 2200.

The memory controller 2100 may perform error correction decoding on the read values, which correspond to the codeword received from the memory device 2200. The received read values may correspond to a single page. For the error correction decoding, at least one of hard decision decoding and soft decision decoding may be used. As the hard decision decoding, for example, error correction decoding using at least one of a Bose Chaudhuri Hocquenghem (BCH) code, a Reed-Solomon code, a Reed-Muller code, a Low Density Parity Check (LDPC) code, and a Hamming code may be used. As the soft decision decoding, for example, error correction decoding using at least one of the LDPC code and a convolution code may be used. In accordance with an embodiment, when a concatenated code is used, soft decision decoding may be performed when hard decision decoding fails.

When error correction decoding on the read values fails, the memory controller 2100 may change a parameter corresponding to the correction target index and retry the error correction decoding. For example, when hard decision decoding is performed, the memory controller 2100 may invert a bit corresponding to the correction target index in the received read values. For example, when soft decision decoding is performed, the memory controller 2100 may change a Log Likelihood Ratio (LLR) value corresponding to the correction target index in the received read values. When the LLR value is corrected, it may mean that at least one of a magnitude and a sign of the LLR value is corrected. The LLR value may be an initial LLR value corresponding to the read values. In accordance with an embodiment, the memory controller 2100 may change an LLR value corresponding to an index adjacent or close to the correction target index. For example, the memory controller 2100 may change the magnitude of the LLR value corresponding to an index adjacent or next to the correction target index a greater amount than the magnitude of the LLR value corresponding to an index further away from the correction target index.

The memory device 2200 may include a volatile memory that does not retain stored data in absence of power supply, or a non-volatile memory that maintains stored data even in absence of power supply. The memory controller 2100 may control the memory device 2200 to perform a program operation, a read operation, an erase operation, a data compression operation, and a copyback operation.

The memory device 2200 may perform a read operation on a plurality of memory cells according to a first read command received from the memory controller 2100 and may transfer read result data to the memory controller 2100. In accordance with an embodiment, the memory device 2200 may perform a first read operation once each time the memory device 2200 receives the A type first read command from the memory controller 2100. In accordance with an embodiment, the memory device 2200 may perform a first read operation a plurality of times (for example, twice) each time the memory device 2200 receives the B type first read command from the memory controller 2100.

The memory device 2200 may transfer read result data corresponding to the first read operation to the memory controller 2100.

The memory device 2200 may perform a second read operation on a plurality of memory cells in response to a second read command received from the memory controller 2100 and may transfer a read values, which correspond to a codeword, as a result of the second read operation to the memory controller 2100.

In accordance with an embodiment, when the memory device 2200 receives a third read command from the memory controller 2100, the memory device 2200 may perform a third read operation corresponding to the third read command a plurality of times (for example, twice). The third read command may be the same as the second read command, or may be different from the first and second read commands. The memory device 2200 may compare respective read data corresponding to a plurality of third read operations and count inverted cells in the plurality of third read operations. When the number of inverted cells exceeds a set or predetermined number, the memory device 2200 may not output read data to the memory controller 2100 and may notify the memory controller 2100 that a read operation corresponding to the third read command fails.

In accordance with an embodiment, the memory device 2200 may set an optimal read voltage by itself. For example, the memory device 2200 may perform a read operation a plurality of times for each of a plurality of read voltages and count inverted cells by comparing read data corresponding to the read operations performed plural times for each of the different read voltages. The memory device 2200 may perform a valley search operation on the basis of a voltage distribution of the inverted cells. The memory device 2200 may set the read voltage corresponding to the searched valley as an optimal read voltage.

Figure 2:
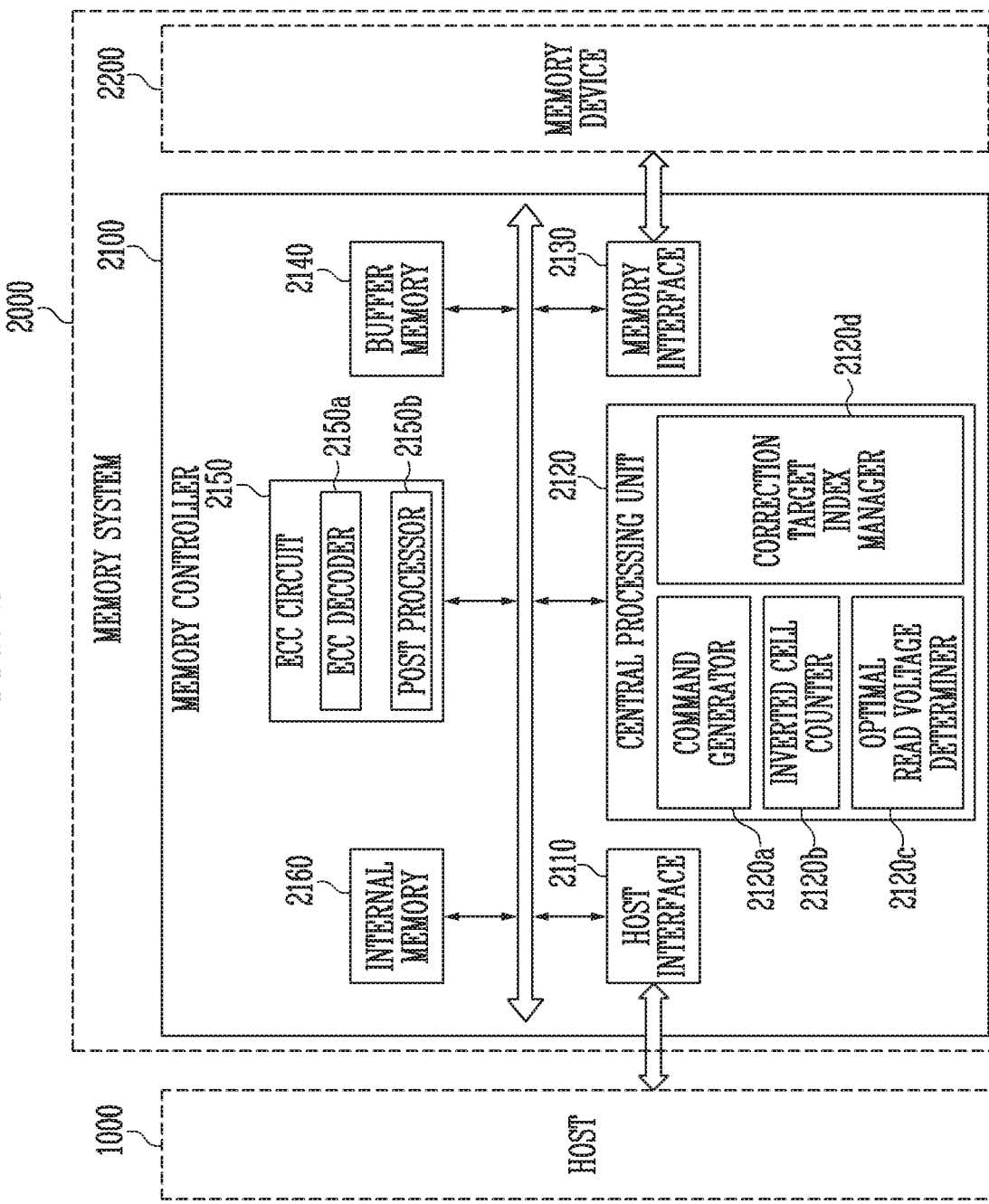
FIG. 2 is a diagram illustrating an exemplary memory controller, such as that shown in FIG. 1.

FIG. 2 is a circuit diagram illustrating the memory controller 2100 shown in FIG. 1.

Referring to FIG. 2, the memory controller 2100 may include a host interface 2110, a central processing unit (CPU) 2120, a memory interface 2130, a buffer memory 2140, an error correction code (ECC) circuit 2150, and an internal memory 2160. The CPU 2120 may control the host interface 2110, the memory interface 2130, the buffer memory 2140, the ECC circuit 2150, and the internal memory 2160.

The host interface 2110 may perform data exchange with the host 1000 using a communication protocol.

The CPU 2120 may perform various operations or generate a command or an address to control the memory device 2200. For example, the CPU 2120 may generate various commands for performing a program operation, a read operation, an erase operation, a data compression operation, and a copyback operation.

The CPU 2120 may include a command generator 2120*a*, an inverted cell counter 2120*b*, an optimal read voltage determiner 2120*c*, and a correction target index manager 2120*d*.

The command generator 2120*a* may generate first read commands so that the memory device 2200 may perform a first read operation a plurality of times using a plurality of different read voltages. In other words, the command generator 2120*a* may change the read voltage and generate a first read command corresponding to the changed read voltage. For example, the command generator 2120*a* may divide a predetermined voltage range into a plurality of different read voltages, generate first read commands corresponding to the different read voltages, respectively, and transfer the first read commands to the memory device 2200.

The command generator 2120*a* may generate an A type first read command or a B type first read command and transfer the generated read command to the memory device 2200. In accordance with an embodiment, the A type first read command may instruct to perform a first read operation once using the corresponding read voltage. When the A type first read command is used, the command generator 2120a may generate a plurality of A type first read commands (e.g., two) for a corresponding read voltage and transfer the generated first read commands to the memory device 2200. In accordance with an embodiment, the B type first read command may instruct to perform a first read operation a plurality of times (e.g., twice) using the corresponding read voltage. When the B type first read command is used, the command generator 2120a may generate a single B type first read command for a corresponding read voltage and transfer the single B type first read command to the memory device 2200.

The inverted cell counter 2120b may count inverted cells on the basis of read result data received from the memory device 2200 in response to the first read command.

In accordance with an embodiment, the read result data received from the memory device 2200 may be read data corresponding to first read operation performed plural times for each of the different read voltages. The inverted cell counter 2120b may compare a plurality of read data for each of the different read voltages, check whether inverted cells showing different bit values by the first read operation performed plural times for each read voltage exist among the plurality of memory cells, and count the checked inverted cells. The inverted cell counter 2120b may provide the optimal read voltage determining 2120c with information about the number of inverted cells for each of the different read voltages. In addition, the inverted cell counter 2120b may check indexes of the inverted cells for each of the different read voltages and provide the correction target index manager 2120d with the indexes of the inverted cells for each of the different read voltages.

In accordance with an embodiment, read result data received from the memory device 2200 may refer to result data of comparing respective read data by the first read operation performed plural times for each of the different read voltages. The read result data may indicate whether the read data from each memory cell is inverted or not. As described above, the read result data may be received in the form of a bit sequence having a length corresponding to a single page, and each of the bits included in the bit sequence may indicate whether a memory cell located at a location corresponding to the bit is inverted or not.

For example, an nth bit in the bit sequence may indicate whether a memory cell corresponding to an nth index is inverted or not, where n is a natural number. For example, when the nth bit has a value of 1, it may mean that the memory cell corresponding to the nth index is an inverted cell, and when the nth bit has a value of 0, it may mean that the memory cell corresponding to the nth index may be a non-inverted cell. In this example, the inverted cell counter 2120b may count inverted cells by counting how many bits having the value of 1 are in the bit sequence. The inverted cell counter 2120b may provide the optimal read voltage determiner 2120c with information about the number of inverted cells with respect to each of the plurality of read voltages. In addition, the inverted cell counter 2120b may provide the correction target index manager 2120d with indexes of inverted cells corresponding to each of the read voltages.

The optimal read voltage determiner 2120c may estimate a threshold voltage distribution of memory cells on the basis of the information about the number of inverted cells received from the inverted cell counter 2120b. The optimal read voltage determiner 2120c may perform a valley search operation on the basis of the estimated threshold voltage distribution and determine, as an optimal read voltage, a read voltage corresponding to the valley identified in the search. The optimal read voltage determiner 2120c may provide the correction target index manager 2120d with information about the determined optimal read voltage.

The correction target index manager 2120d may check and store a correction target index on the basis of the indexes of the inverted cells corresponding to each of the read voltages received from the inverted cell counter 2120b and the information about the optimal read voltage received from the optimal read voltage determiner 2120c. For example, the correction target index manager 2120d may store an index corresponding to the optimal read voltage received from the optimal read voltage determiner 2120c as a correction target index, among the indexes received from the inverted cell counter 2120b. The correction target index may be provided to the ECC circuit 2150 for error correction decoding.

The memory interface 2130 may communicate with the memory device 2200 using a communication protocol.

The buffer memory 2140 may temporarily store data when the memory controller 2100 controls the memory device 2200. For example, the data received from the host 1000 may be temporarily stored in the buffer memory 2140 until a program operation is completed. In addition, during a read operation, data read from the memory device 2200 may be temporarily stored in the buffer memory 2140.

The ECC circuit 2150 may perform error correction encoding during a program operation and error correction decoding during a read operation for error detection. The ECC circuit 2150 may include an ECC decoder 2150a and a post processor 2150b.

The ECC decoder 2150a may perform error correction decoding on read values, which correspond to a codeword, in corresponding to a second read operation. The ECC decoder 2150a may include at least one of a hard decision decoder and a soft decision decoder. For example, the ECC decoder 2150a may be the hard decision decoder or the soft decision decoder. For example, the ECC decoder 2150a may be a concatenated decoder consisting of a hard decision decoder or a soft decision decoder.

The ECC decoder 2150a may perform error correction decoding on the read values, which correspond to a codeword, corresponding to the second read operation and output the decoded codeword when the error correction decoding is successful.

The ECC decoder 2150a may change a parameter used in the error correction decoding under the control of the post processor 2150b when the error correction decoding on the read values fails. For example, the ECC decoder 2150a may perform error correction decoding using a read values in which an arbitrary bit is inverted or a changed LLR value.

The post processor 2150b may receive a correction target index from the CPU 2120 when the error correction decoding by the ECC decoder 2150a fails. When hard decision decoding is used, the post processor 2150b may control the ECC decoder 2150a to invert a bit corresponding to the correction target index in the read values which correspond to a codeword. When soft decision decoding is used, the post processor 2150b may control the ECC decoder 2150a to change an LLR value corresponding to the correction target index in the read values which correspond to a codeword. For example, the post processor 2150b may control the ECC decoder 2150a to change at least one of a sign and a magnitude of the LLR value. In addition, the post processor 2150b may control the ECC decoder 2150a to control at least one of a sign and a magnitude corresponding to an index adjacent to the correction target index. The post processor 2150b may control the ECC decoder 2150a to change the magnitude of the LLR value by a greater amount as the adjacent index is closer to the correction target index.

The ECC decoder 2150a may change a parameter in response to control of the post processor 2150b and perform error correction decoding on read values, which correspond to a codeword, with the changed parameter. When error correction decoding succeeds, the ECC decoder 2150a may output the decoded codeword.

The internal memory 2160 may serve as a storage storing various types of information necessary for operations of the memory controller 2100. The internal memory 2160 may store a plurality of tables. For example, the internal memory 2160 may store a mapping table of a logical address and a physical address.

Figure 3:
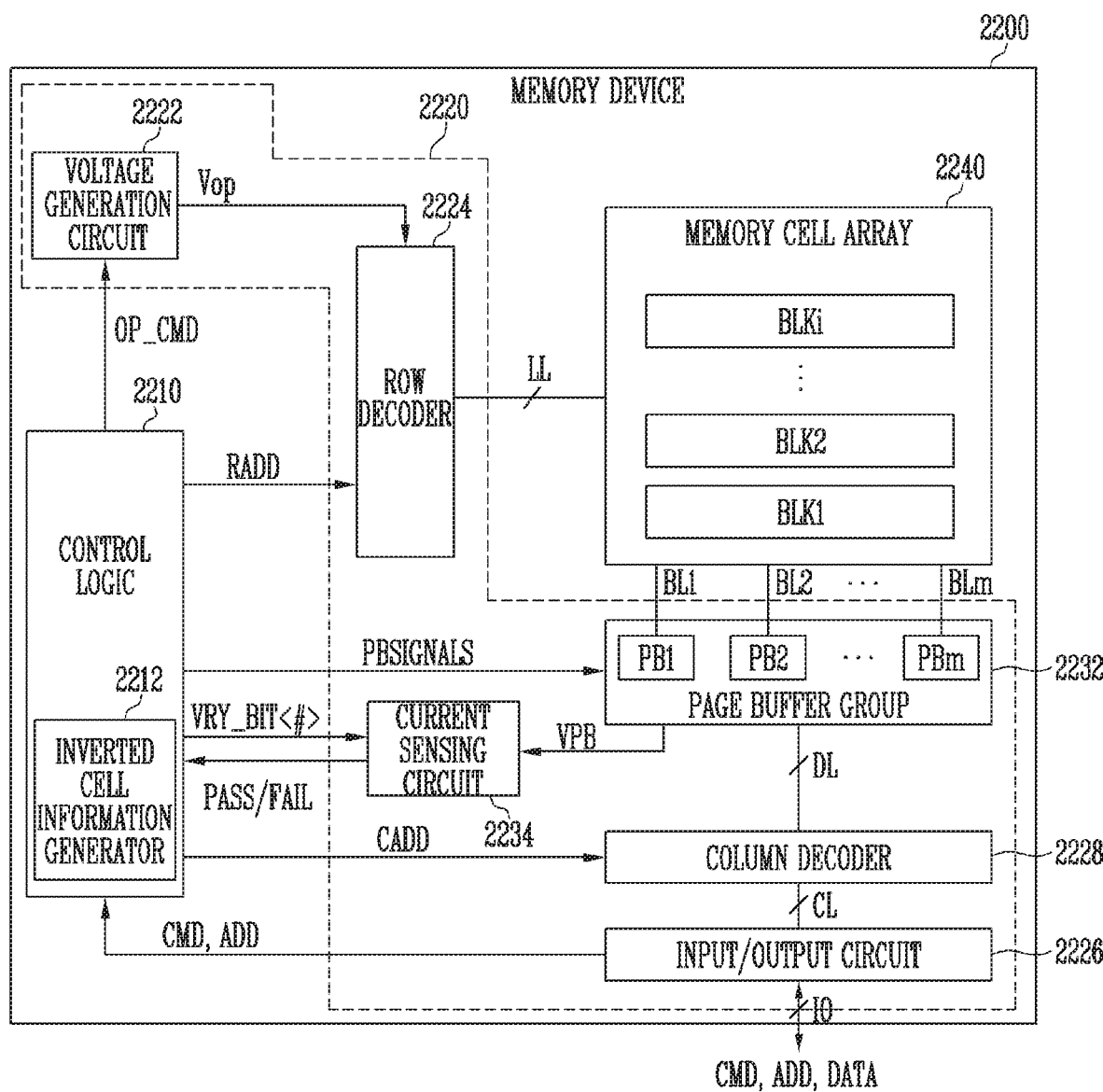
FIG. 3 is a diagram illustrating a memory device in accordance with an embodiment.

FIG. 3 is a diagram illustrating the memory device 2200 in accordance with an embodiment. The memory device 2200 shown in FIG. 3 may be applied to the memory system 2000 shown in FIGS. 1 and 2.

The memory device 2200 may include a control logic 2210, peripheral circuits 2220, and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 shown in FIGS. 1 and 2.

The control logic 2210 may control the peripheral circuits 2220 in response to a command CMD and an address ADD received from the memory controller 2100 through the input/output circuit 2226. For example, the control logic 2210 may output an operation signal OP_CMD, a row address RADD, page buffer control signals PBSIGNALS, an allowable bit VRY_BIT<#>, and a column address CADD in response to the command CMD and the address ADD. The control logic 2210 may determine whether a verify operation passes or fails in response to a pass signal PASS and a fail signal FAIL received from the current sensing circuit 2234.

The control logic 2210 may perform a first read operation once when an A type first read command is received, and may perform the first read operation a plurality of times (for example, twice) when a B type first read command is received.

The control logic 2210 may transfer read result data corresponding to the first read command to the memory controller 2100. In accordance with an embodiment, the control logic 2210 may transfer read data corresponding to the first read command to the memory controller 2100. In accordance with an embodiment, the control logic 2210 may include an inverted cell information generator 2212. The inverted cell information generator 2212 may compare a plurality of read data corresponding to a plurality of performances of the first read command at different read voltages, generate data indicating inverted cells showing different bit values for the plurality of first read operations, and may transfer the generated data to the memory controller 2100.

The peripheral circuits 2220 may perform a program operation to store data in the memory cell array 2240, a read operation to output the data stored in the memory cell array 2240, and an erase operation to erase the data stored in the memory cell array 2240.

The voltage generation circuit 2222 may generate various operating voltages Vop used in a program operation, a read operation, and an erase operation in response to the operation signal OP_CMD received from the control logic 2210. For example, the voltage generation circuit 2222 may transfer a program voltage, a verify voltage, a pass voltage, a read voltage, an erase voltage, and a turn-on voltage to the row decoder 2224.

The row decoder 2224 may transfer the operating voltages Vop to local lines LL coupled to a selected memory block, among memory blocks included in the memory cell array 2240, in response to the row address RADD received from the control logic 2210. The local lines LL may include local word lines, local drain select lines, and local source select lines. In addition, the local lines LL may include various lines coupled to a memory block, such as a source line.

The input/output circuit 2226 may transfer the command CMD and the address ADD received from the memory controller 2100 through input/output lines IO to the control logic 2210, or may exchange the data DATA with the column decoder 2228.

The column decoder 2228 may transfer data between the input/output circuit 2226 and the page buffer group 2232 in response to the column address CADD received from the control logic 2210. For example, the column decoder 2228 may exchange data with page buffers PB1 to PBm through data lines DL, or may exchange data with the input/output circuit 2226 through column lines CL.

The page buffer group 2232 may be coupled to bit lines BL1 to BLm commonly coupled to memory blocks BLK1 to BLKi. The page buffer group 2232 may include the plurality of page buffers PB1 to PBm coupled to the bit lines BL1 to BLm. For example, a single page buffer may be coupled to each of the bit lines BL1 to BLm. The page buffers PB1 to PBm may operate in response to the page buffer control signals PBSIGNALS. For example, the page buffers PB1 to PBm may temporarily store program data received from the memory controller 2100 during a program operation and may control voltages applied to the bit lines BL1 to BLm according to the program data. In addition, the page buffers PB1 to PBm may temporarily store data received through the bit lines BL1 to BLm during a read operation, or may sense voltages or currents in the bit lines BL1 to BLm.

The current sensing circuit 2234 may generate a reference current in response to the allowable bit VRY_BIT<#> received from the control logic 2210 during a read operation or verify operation, and may output the pass signal PASS or the fail signal FAI by comparing a reference voltage generated by the reference current with a sensing voltage VPB received from the page buffer group 2232.

The memory cell array 2240 may include the plurality of memory blocks BLK1 to BLKi storing data. The memory blocks BLK1 to BLKi may store user data and various types of information for performing the operations of the memory device 2200. The memory blocks BLK1 to BLKi may have a two-dimensional structure or a three-dimensional structure, and may be configured in the same manner as each other.

Figure 4:
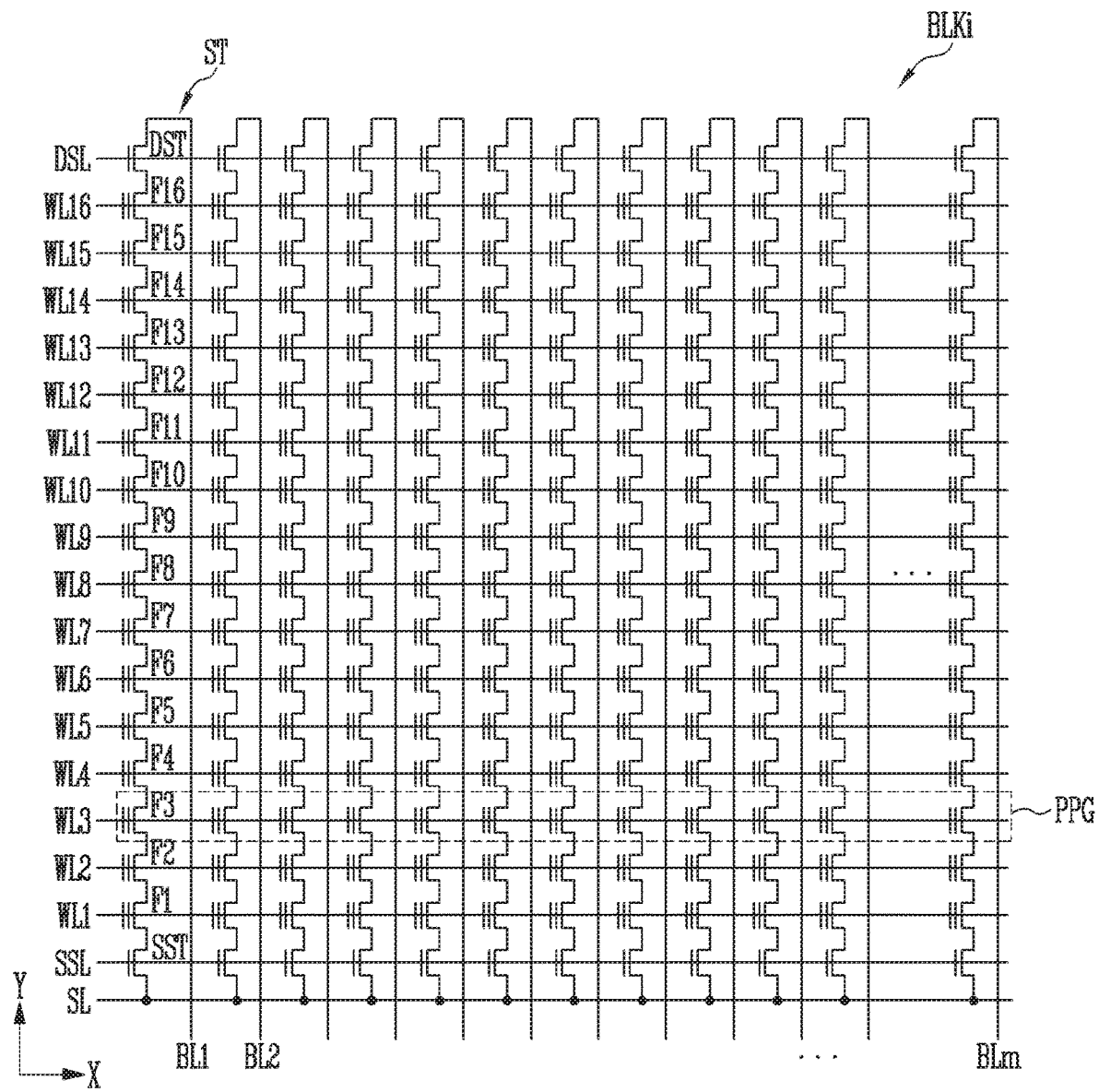
FIG. 4 is an exemplary circuit diagram of a memory block.

FIG. 4 is a circuit diagram illustrating an exemplary memory block.

A memory cell array may include a plurality of memory blocks. FIG. 4 illustrates a representative one (BLKi) of the plurality of memory blocks.

The memory block BLKi may be coupled to a plurality of word lines arranged in parallel between a first select line and a second select line. The first select line may be a source select line SSL and the second select line may be a drain select line DSL. More specifically, the memory block BLKi may include a plurality of strings ST coupled between bit lines BL1 to BLn and a source line SL. Each of the bit lines BL1 to BLm may be coupled to each of the strings ST, and the source line SL may be commonly coupled to the strings ST. Since the strings ST may have the same configuration as each other, the string ST coupled to the first bit line BL1 is described in detail as an example.

The string ST may include a source select transistor SST, a plurality of memory cells F1 to F16, and a drain select transistor DST coupled in series between the source line SL and the first bit line BL1. One string ST may include at least one source select transistor SST and at least one drain select transistors DST, and may include more than the 16 memory cells F1 to F16 shown in FIG. 4.

The source line SL may be coupled to a source of the source select transistor SST, and the first bit line BL1 may be coupled to a drain of the drain select transistor DST. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to a plurality of word lines WL1 to WL16. A group of memory cells coupled to the same word line, among memory cells in different strings ST, may be referred to as a physical page PPG. Therefore, the memory block BLKi may include as many physical pages PPG as the number of word lines WL1 to WL16.

A single memory cell may store one bit of data. This memory cell is called a single level cell (SLC). A single physical page PPG may store data corresponding to a single logical page LPG. Data of the single logical page LPG may include as many data bits as the number of cells in the single physical page PPG. For example, when data of two or more bits is stored in a single memory cell, a single physical page PPG may store data of two or more logical pages LPG. For example, in a memory device driven in MLC type, two logical page data may be stored in the single physical page PPG, and in a memory device driven in TLC type, three logical page data may be stored in the single physical page PPG.

Figure 5:
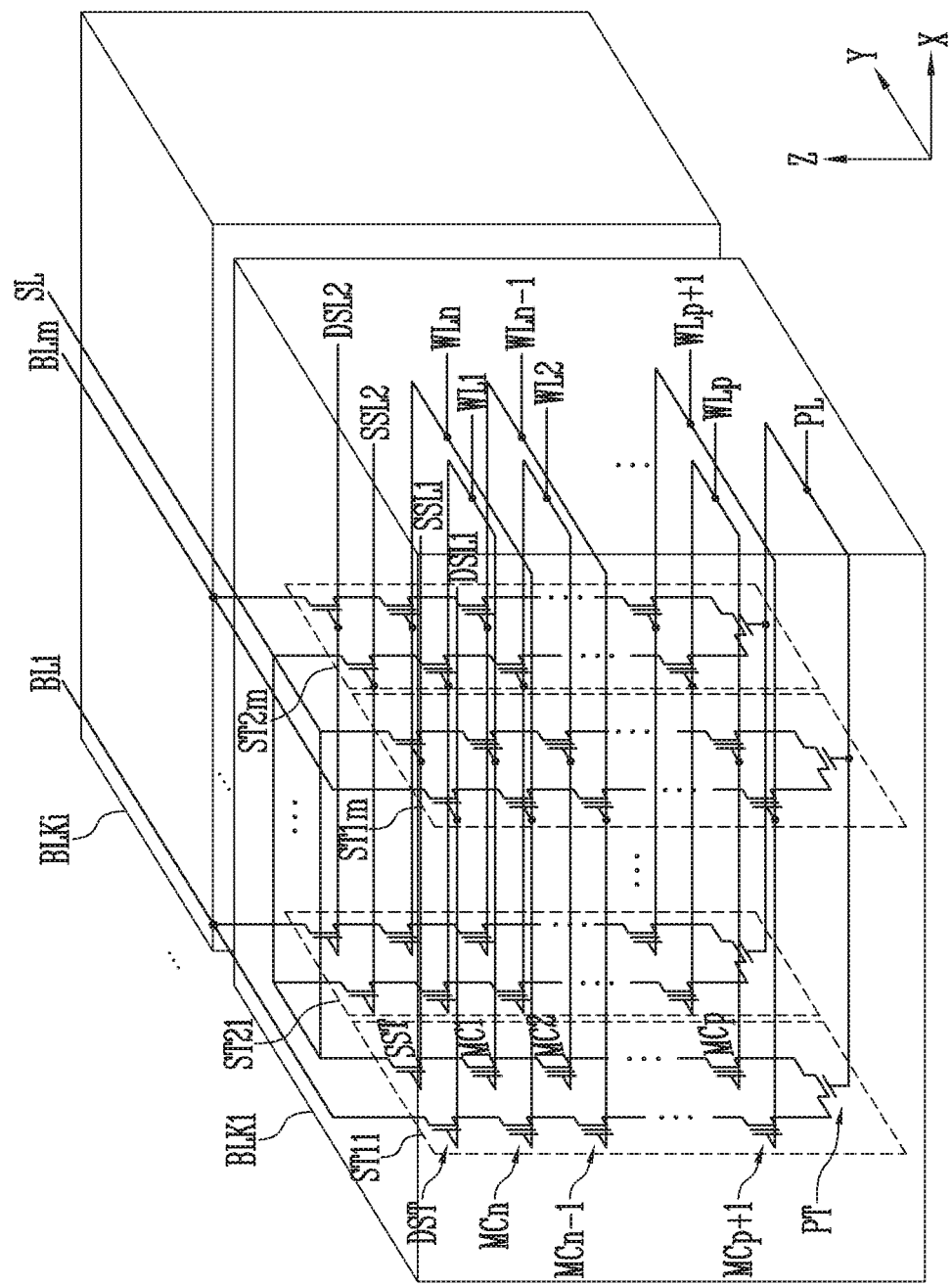
FIG. 5 is a diagram illustrating an embodiment of a memory block having a three-dimensional structure.

FIG. 5 is a diagram illustrating an embodiment of a memory block having a three-dimensional structure.

The memory cell array 2240 may include the plurality of memory blocks BLK1 to BLKi. For example, the first memory block BLK1 may include a plurality of strings ST11 to ST1*m* and ST21 to ST2*m*. In accordance with an embodiment, each of the plurality of strings ST11 to ST1*m* and ST21 to ST2*m* may have a 'U' shape. In the first memory block BLK1, 'm' strings may be arranged in a row direction (X direction). By way of example, FIG. 5 illustrates two strings arranged in a column direction (Y direction). However, three or more strings may be arranged in the column direction (Y direction).

Each of the plurality of strings ST11 to ST1*m* and ST21 to ST2*m* may include at least one source select transistor SST, first to nth memory cells MC1 to MCn, a pipe transistor PT, and at least one drain select transistor DST.

The source and drain select transistors SST and DST and the memory cells MC1 to MCn may have similar structures to each other. For example, each of the source and drain select transistors SST and DST and the memory cells MC1 to MCn may include a channel layer, a tunnel insulating layer, a charge trap layer, and a blocking insulating layer. For example, a pillar for providing a channel layer may be provided in each string. For example, a pillar for providing at least one of the channel layer, the tunnel insulating layer, the charge trap layer, and the blocking insulating layer may be provided in each string.

The source select transistor SST of each string may be coupled between the source line SL and memory cells MC1 to MCp.

In accordance with an embodiment, source select transistors of strings arranged in the same row may be coupled to a source select line extending in a row direction, and source select transistors of strings arranged in different rows may be coupled to different source select lines. As shown in FIG. 5, source select transistors of the strings ST11 to ST1*m* in the first row may be coupled to a first source select line SSL1. Source select transistors of the strings ST21 to ST2*m* in the second row may be coupled to a second source select line SSL2.

In accordance with another embodiment, the source select transistors of the strings ST11 to ST1*m* and ST21 to ST2*m* may be commonly coupled to one source select line.

The first to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction) and be coupled in series between the source select transistor SST and the pipe transistor PT. The (p+1)th to nth memory cells MCp+1 to MCn may be sequentially arranged in the vertical direction (Z direction) and be coupled in series between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to the first to nth word lines WL1 to WLn, respectively.

In accordance with an embodiment, at least one of the first to nth memory cells MC1 to MCn may serve as a dummy memory cell. When a dummy memory cell is provided, a voltage or current of the corresponding string may be stably controlled. A gate of the pipe transistor PT of each string may be coupled to a pipe line PL.

The drain select transistor DST of each string may be coupled between the bit line and the memory cells MCp+1 to MCn. Strings arranged in a row direction may be coupled to a drain select line extending in the row direction. Drain select transistors of the strings ST11 to ST1*m* in the first row may be coupled to a first drain select line DSL1. Drain select transistors of the strings ST21 to ST2*m* in the second row may be coupled to a second drain select line DSL2.

Strings arranged in a column direction may be coupled to bit lines extending in the column direction. As shown in FIG. 5, the strings ST11 and ST21 in the first column may be coupled to the first bit line BL1. The strings ST1*m* and ST2*m* in an mth column may be coupled to an mth bit line BLm.

Memory cells coupled to the same word line, among strings arranged in the row direction, may form a single page. For example, memory cells coupled to the first word line WL1 of the strings ST11 to ST1*m* in the first row may form a single page. Memory cells coupled to the first word line WL1 of the strings ST21 to ST2*m* in the second row may form a single page. When one between the drain select lines DSL1 and DSL2 is selected, strings arranged in one row direction may be selected. One page of selected strings may be selected when one of the word lines WL1 to WLn is selected.

Figure 6:
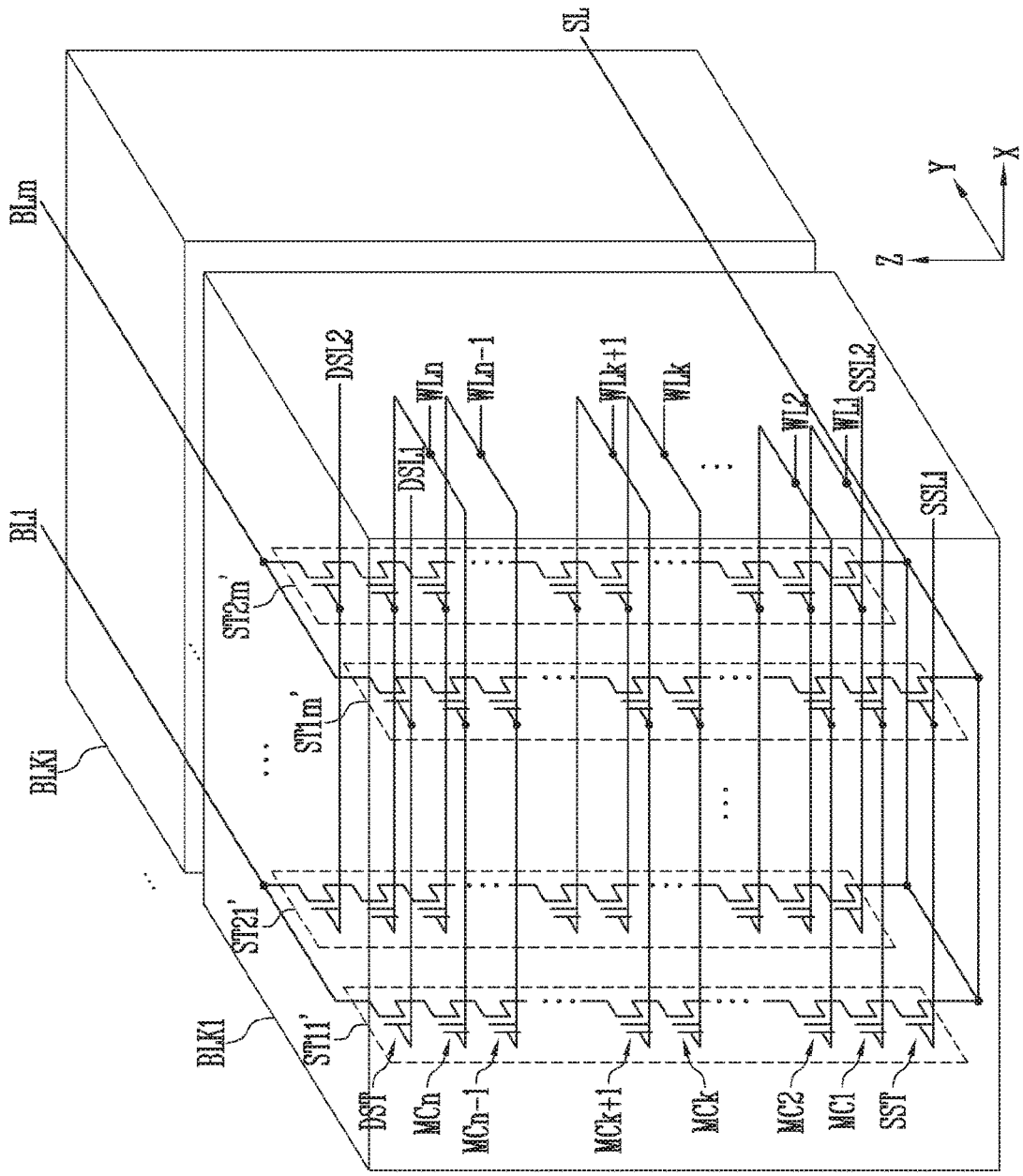
FIG. 6 is a diagram illustrating another embodiment of a memory block having a three-dimensional structure.

FIG. 6 is a diagram illustrating another embodiment of a memory block having a three-dimensional structure.

The memory cell array 2240 may include the plurality of memory blocks BLK1 to BLKi. For example, the first memory block BLK1 may include a plurality of strings ST11' to ST1m' and ST21' to ST2m'. Each of the plurality of strings ST11' to ST1m' and ST21' to ST2m' may extend in a vertical direction (Z direction). In the memory block BLKi, 'm' strings may be arranged in a row direction (X direction). By way of example, FIG. 6 illustrates two strings arranged in a column direction (Y direction). However, three or more strings may be arranged in the column direction (Y direction).

Each of the plurality of strings ST11' to ST1m' and ST21' to ST2m' may include at least one source select transistor SST, the first to nth memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. Source select transistors of the strings ST11' to ST1m' arranged in the first row may be coupled to the first source select line SSL1. Source select transistors of the strings ST21' to ST2m' arranged in the second row may be coupled to the second source select line SSL2. In accordance with another embodiment, the source select transistors of the strings ST11' to ST1m' and ST21' to ST2m' may be commonly coupled to a single source select line.

The first to nth memory cells MC1 to MCn of each string may be coupled in series between the source select transistor SST and the drain select transistor DST. Gates of the first to nth memory cells MC1 to MCn of each string may be coupled to the first to nth word lines WL1 to WLn, respectively.

In accordance with an embodiment, at least one of the first to nth memory cells MC1 to MCn may serve as a dummy memory cell. When a dummy memory cell is provided, a voltage or current of the corresponding string may be stably controlled. Therefore, the reliability of data stored in the memory block BLK1 may be improved.

The drain select transistor DST of each string may be coupled between the bit line and the memory cells MC1 to MCn. The drain select transistors DST of the strings arranged in the row direction may be coupled to a drain select line extending in the row direction. The drain select transistors DST of the strings ST11' to ST1m' in the first row may be coupled to the first drain select line DSL1. The drain select transistors DST of the strings ST21' to ST2m' in the second row may be coupled to the second drain select line DSL2.

In other words, the memory block BLK1 shown in FIG. 6 may have a similar equivalent circuit to the memory block BLK1 shown in FIG. 5 except that the pipe transistor PT is removed from each string.

FIG. 7 is a flowchart illustrating a method of operating a memory controller shown in FIGS. 1 and 2.

At step 701, the memory controller may generate and transmit first read commands respectively corresponding to the plurality of read voltages so that a first read operation corresponding to each of the read voltages may be performed a plurality of times. The first read command may be an A type first read command or a B type first read command. In accordance with an embodiment, the A type first read command may instruct to perform a first read operation using the corresponding read voltage once. The A type first read command may be transferred a plurality of times corresponding to each of the read voltages. The B type first read command may instruct to perform a first read operation a plurality of times (for example, twice) for each of the different read voltages. The B type first read command may be transferred once for each of the read voltages.

At step 703, the memory controller may receive read result data corresponding to the first read command from the memory device. In accordance with an embodiment, the read result data may be read data corresponding to a plurality of read operations, respectively. In accordance with an embodiment, read result data may indicate whether the read data from each of the memory cells is inverted or not by a first read operation performed plural times for each of the different read voltages.

At step 705, the memory controller may count inverted cells on the basis of the read result data received from the memory device. In accordance with an embodiment, when the read result data are read data corresponding to the plurality of read voltages, respectively, inverted cells may be checked by comparing the read data for each read voltage, and the checked inverted cells may be counted. In accordance with an embodiment, when read result data indicate whether the read data from each of the memory cells is inverted or not by the first read operation performed plural times for each of the different read voltages, inverted cells may be counted by analyzing the corresponding data.

At step 707, the memory controller may estimate a threshold voltage distribution of memory cells from the voltage distribution of inverted cells.

At step 709, the memory controller may perform a valley search operation on the basis of the estimated threshold voltage distribution.

At step 711, the memory controller may set a read voltage corresponding to a valley as an optimal read voltage. For example, when memory cells are n-bit multi-level cells (MLC), the memory controller may set $2^n-1$ optimal read voltages corresponding to $2^n-1$ valleys, respectively.

Subsequently, the memory controller may control the memory device to perform a second read operation using the optimal read voltage.

FIG. 8A illustrates exemplary read result data in accordance with an embodiment.

FIG. 8A illustrates an example in which read data respectively corresponding to the first read operation performed two times at a particular read voltage $V_1$ are received as read result data.

Referring to FIG. 8A, read data {110110 . . . 110110} may be received as a result of the firstly performed first read operation, and read data {111110 . . . 100110} may be received as a result of the secondly performed first read operation.

When the first read data and the second read data are compared against each other, it may be seen that a cell corresponding to the third index and a cell corresponding to an (n−4)th index have inverted bits. In other words, the memory controller may determine the number of inverted cells by comparing read data corresponding to a first read operation performed plural times at a particular read voltage, and may locate inverted cells by checking what bits are inverted.

FIG. 8B illustrates exemplary read result data in accordance with another embodiment.

FIG. 8B illustrates an example in which data indicating whether read data from each of the memory cells is inverted or not by the first read operation performed plural times for a particular one among the different read voltages is received as read result data.

For example, in a bit sequence shown in FIG. 8B, a bit expressed as 1 may indicate an inverted cell, and a bit expressed as 0 may indicate a non-inverted cell. In other words, the memory device may check indexes of inverted cells by comparing read data corresponding to the first read operation performed plural times at a single read voltage, and may generate and transfer read result data to the memory controller so that inverted cells and non-inverted cells may be differentiated from each other.

Therefore, the memory controller may analyze the read result data received from the memory device, determine or count the inverted cells, and check indexes of the inverted cells. In the example shown in FIG. 8B, the memory controller may determine the inverted cells by counting how many bits are expressed as 1, and may check indexes of the inverted cells by checking where the bits expressed as 1 are located in the bit sequence.

FIG. 9 illustrates an exemplary voltage distribution of inverted cells and a threshold voltage distribution of memory cells.

FIG. 9 shows the actual threshold voltage distribution of a plurality of memory cells and a threshold voltage distribution estimated through a first read operation performed plural times for each read voltage. Referring to FIG. 9, it is shown that the voltage distribution of inverted cells is closely aligned with the actual threshold voltage distribution.

In other words, the memory controller may estimate the threshold voltage distribution from the voltage distribution of inverted cells and search for valleys of the estimated threshold voltage distribution. In addition, the memory controller may set a read voltage for each of the valleys as an optimal read voltage.

FIG. 10 is a flowchart illustrating a method of operating the memory controller shown in FIGS. 1 and 2.

At step 1001, the memory controller may manage a correction target index. Step 1001 may be performed after step 711 of FIG. 7 is performed. In other words, when an optimal read voltage is determined, the memory controller may check an inverted cell corresponding to the optimal read voltage, and manage an index of the checked inverted cell as the correction target index.

At step 1003, the memory controller may transfer a second read command corresponding to the optimal read voltage to the memory device.

At step 1005, the memory controller may receive read values, which correspond to a codeword, corresponding to a second read operation from the memory device.

At step 1007, the memory controller may perform error correction decoding on the received read values. For the error correction decoding, at least one of hard decision decoding and soft decision decoding may be used. For example, the memory controller may perform hard decision decoding using hard decision data on the received read values, or may perform soft decision decoding using soft decision data on the received read values. When the error correction decoding is successful, step 1009 may be performed; otherwise, step 1011 may be performed.

At step 1011, the memory controller may correct or change a parameter corresponding to the correction target index. For example, when the hard decision decoding is used, the memory controller may invert a bit corresponding to the correction target index. For example, when the soft decision decoding is used, the memory controller may correct an LLR value corresponding to the correction target index. When the LLR value is corrected, it may mean that at least one of a magnitude and a sign of the LLR value is corrected.

At step 1013, the memory controller may perform error correction decoding using the hard decision data or the soft decision data in which a parameter is corrected or changed. When the error correction decoding is successful, step 1009 may be performed, and otherwise, step 1021 may be performed.

At step 1009, the memory controller may output the decoded codeword.

At step 1021, the memory controller may determine that the error correction decoding failed.

Figure 11A:
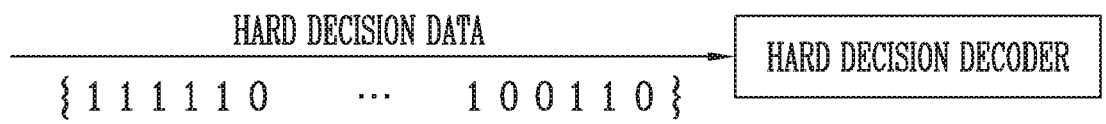
FIGS. 11A and 11B are diagrams illustrating processes of correcting hard decision data in accordance with an embodiment.
Figure 11B:
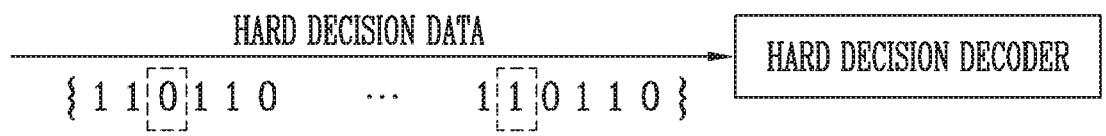

FIGS. 11A and 11B are diagrams illustrating processes of correcting hard decision data in accordance with an embodiment.

First, as shown in FIG. 11A, it may be assumed that error correction decoding is performed on hard decision data {111110 . . . 100110}. Here, the hard decision data consists of n bits, and when error correction decoding on the hard decision data {111110 . . . 100110} fails, the memory controller may retry the error correction decoding by changing the hard decision data {111110 . . . 100110}.

In the illustrated embodiment, the correction target indexes are the 3rd and n−4th indexes, as shown in FIG. 11B, where the leftmost bit corresponds to a 1st index and the rightmost bit corresponds to an nth index. Thus, the bits corresponding to these indexes may be inverted and error correction decoding may be retried. Referring to FIG. 11B, the error correction decoding may be retried using the hard decision data {110110 . . . 110110} in which the bits corresponding to the 3rd and (n−4)th indexes are inverted in comparison with the hard decision data shown in FIG. 11A.

FIGS. 12A to 12E are diagrams illustrating processes of correcting soft decision data in accordance with an embodiment.

By way of example, FIGS. 12A to 12E illustrate that soft decision data of seven bits is used.

Figure 12A:
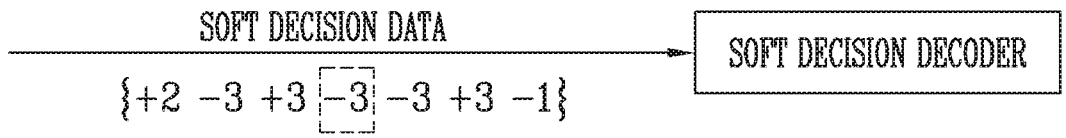
FIGS. 12A to 12E are diagrams illustrating processes of correcting soft decision data in accordance with an embodiment.

First, as shown in FIG. 12A, error correction decoding is performed on soft decision data {+2 −3 +3 −3 −3 +3 −1}. Each of the symbols included in the soft decision data {+2 −3 +3 −3 −3 +3 −1} is an LLR value. When the error correction decoding on the soft decision data {+2 −3 +3 −3 −3 +3 −1} fails, the memory controller may retry the error correction decoding by correcting or changing the soft decision data {+2 −3 +3 −3 −3 +3 −1}.

In FIGS. 12A to 12E, the correction target index is the 4th, where an index of an LLR value at the very left in the soft decision data is the 1st index and an index of an LLR value at the very right is the 7th index.

Figure 12B:
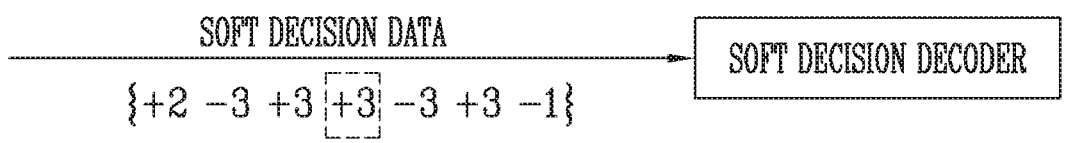
Figure 12C:
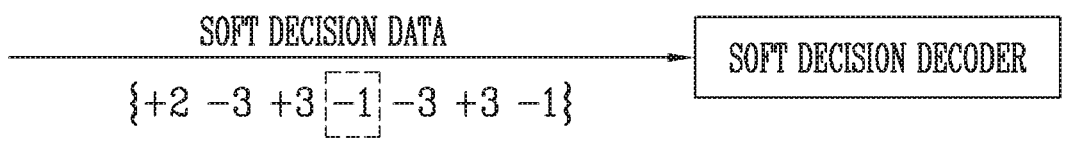

The memory controller may correct or change the LLR value corresponding to the 4th index. In accordance with an embodiment, the memory controller may change a sign of the LLR value corresponding to that index. FIG. 12B illustrates an example in which the sign of the LLR value corresponding to the 4th index is changed from negative (−) to positive (+). In accordance with an embodiment, the memory controller may alternatively change a magnitude of the LLR value corresponding to the 4th index. FIG. 12C illustrates an example in which the magnitude of the LLR value corresponding to the 4th index is changed from 3 to 1 relative to the corresponding LLR value shown in FIG. 12A.

Figure 12D:
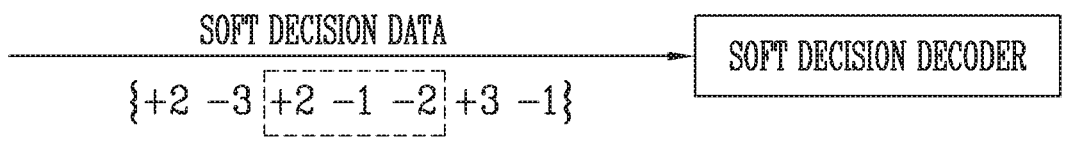

In accordance with an embodiment, the memory controller may correct or change an LLR value corresponding to an index adjacent to the 4th index. FIG. 12D illustrates an example in which magnitudes of LLR values corresponding to the 3rd and 5th indexes adjacent to the 4th index are corrected from 3 to 2 relative to the corresponding LLR values shown in FIG. 12C.

Figure 12E:
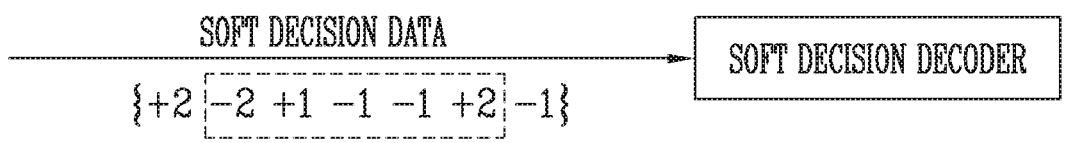

In accordance with an embodiment, the memory controller may correct LLR values corresponding to indexes within a set or predetermined distance from the 4th index. FIG. 12E illustrates an example in which magnitudes of LLR values corresponding to the 2nd, 3rd, 5th and 6th indexes, each of which is within a distance of 2 from the 4th index, are corrected relative to the corresponding LLR values shown in FIG. 12C. The memory controller may more significantly correct a magnitude of an LLR value that is closer to the 4th index. That is, as the distance between the corresponding index and the 4th index decreases, the more significant the magnitude of the corresponding index may be changed. For example, referring to FIG. 12E, magnitudes of LLR values corresponding to the 2nd and 6th indexes, each having a distance of 2 from the 4th index, may be corrected from 3 to 2, and magnitudes of LLR values corresponding to the 3rd and 5th indexes, each having a distance of 1 from the 4th index, may be corrected from 3 to 1 in comparison with FIG. 12C.

Figure 13:
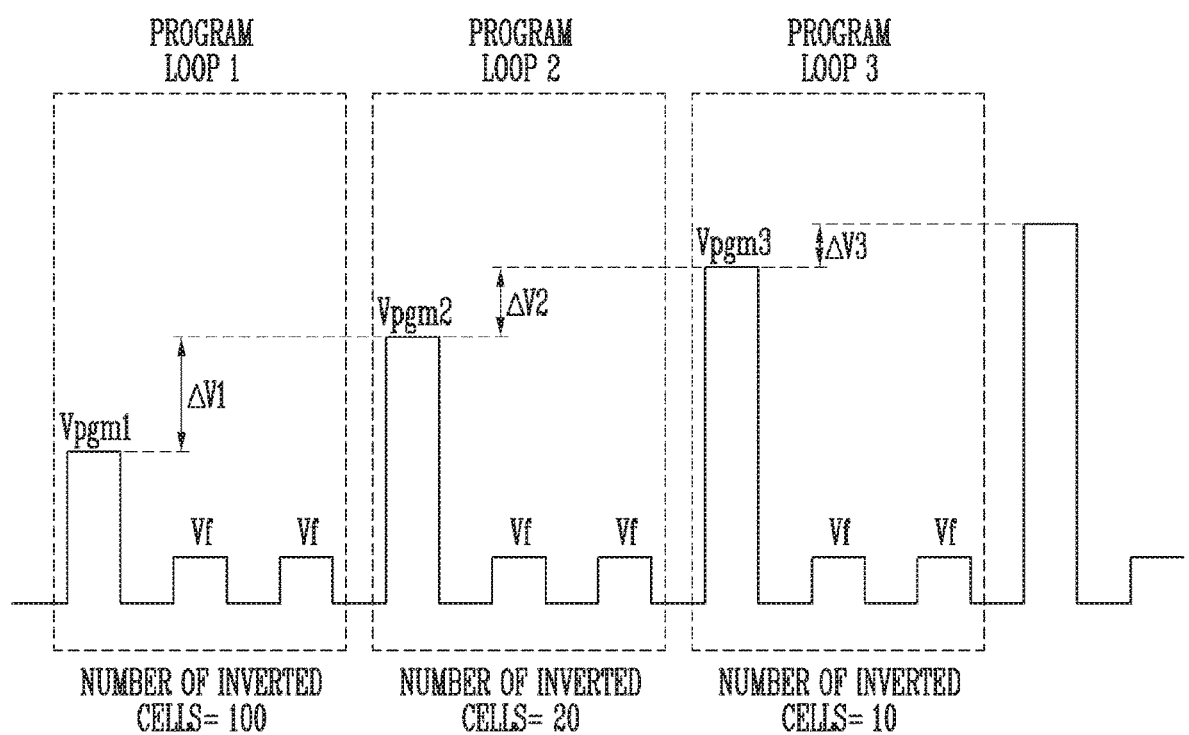
FIG. 13 is a diagram illustrating a method of changing a program step voltage in accordance with an embodiment.

FIG. 13 is a diagram illustrating a method of changing a program step voltage in accordance with another embodiment.

When a program operation is performed according to an Incremental Step Pulse Program (ISPP) scheme, the memory device may control a program step voltage according to a program verify result.

FIG. 13 shows an example in which a plurality of program verify operations using the same verify voltage Vf are performed in each program loop.

In a first program loop (PROGRAM LOOP 1), a program voltage Vpgm1 is applied to a plurality of memory cells and verify result data corresponding to a plurality of verify operations using the same verify voltage Vf indicate that hundred memory cells are inverted, and a program step voltage, to be added to the program voltage Vpgm1 to generate a program voltage Vpgm2 to be applied in a second program loop (PROGRAM LOOP 2), is determined as $\Delta V1$.

In the second program loop, in which verify result data corresponding to a plurality of verify operations using the same verify voltage Vf indicate that twenty memory cells are inverted, and a program step voltage $\Delta V2$, to be added to the program voltage Vpgm2 to generate a program voltage Vpgm3 to be applied in a third program loop (PROGRAM LOOP 3), may be determined to be smaller than $\Delta V1$. In other words, the memory device may increase the program step voltage as the number of inverted cells increases in a plurality of verify operations using the same verify voltage, and may reduce the program step voltage as the number of inverted cells decreases.

Figure 14:
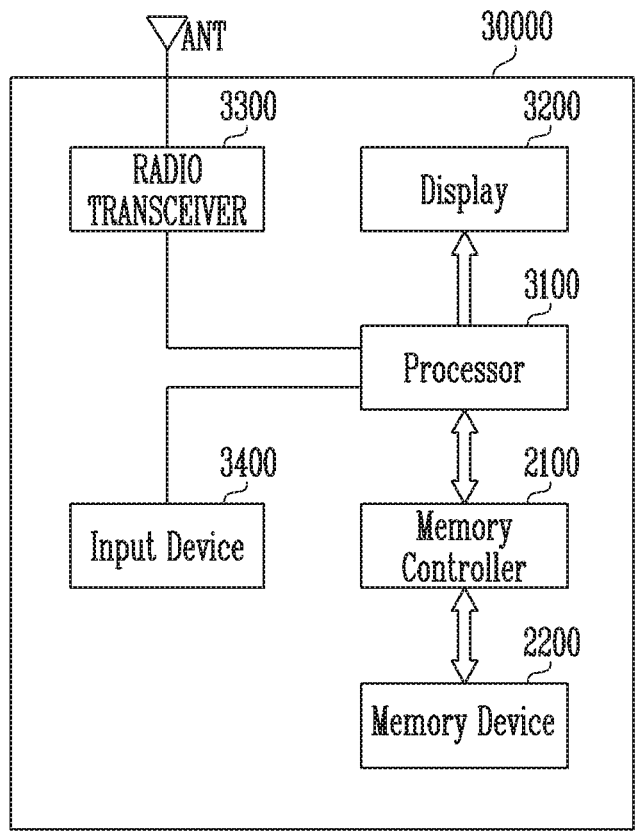
FIGS. 14 to 17 are diagrams illustrating other examples of a memory system including a memory controller, such as that shown in FIGS. 1 and 2, in accordance with various embodiments.

FIG. 14 is a diagram illustrating another example of a memory system including a memory controller shown in FIGS. 1 and 2.

Referring to FIG. 14, a memory system 30000 may be embodied into a cellular phone, a smart phone, a tablet, a personal computer (PC), a personal digital assistant (PDA), or a wireless communication device. The memory system 30000 may include the memory device 2200 and the memory controller 2100 controlling the operations of the memory device 2200.

The memory controller 2100 may control a data access operation of the memory device 2200, for example, a program operation, an erase operation, or a read operation of the memory device 2200 in response to control of a processor 3100.

The memory controller 2100 may control data programmed into the memory device 2200 to be output through a display 3200.

A radio transceiver 3300 may convert a radio signal received or transmitted through an antenna ANT. For example, the radio transceiver 3300 may convert the received radio signal into a signal which can be processed by the processor 3100. Therefore, the processor 3100 may process the signal output from the radio transceiver 3300 and transfer the processed signal to the memory controller 2100 or the display 3200. The memory controller 2100 may program the processed signal into the semiconductor memory device 2200. In addition, the radio transceiver 3300 may convert a signal output from the processor 3100 into a radio signal, and output the radio signal to an external device through the antenna ANT. A control signal for controlling the operations of the processor 3100 or data to be processed by the processor 3100 may be input by an input device 3400, which may include a pointing device, such as a touch pad and a computer mouse, a keypad, or a keyboard. The processor 3100 may control the operations of the display 3200 so that data output from the memory controller 2100, data output from the radio transceiver 3300, or data output from an input device 3400 may be output through the display 3200.

In accordance with an embodiment, the memory controller 2100 capable of controlling the operations of the memory device 2200 may form a portion of the processor 3100, or may be formed as a separate chip from the processor 3100.

Figure 15:
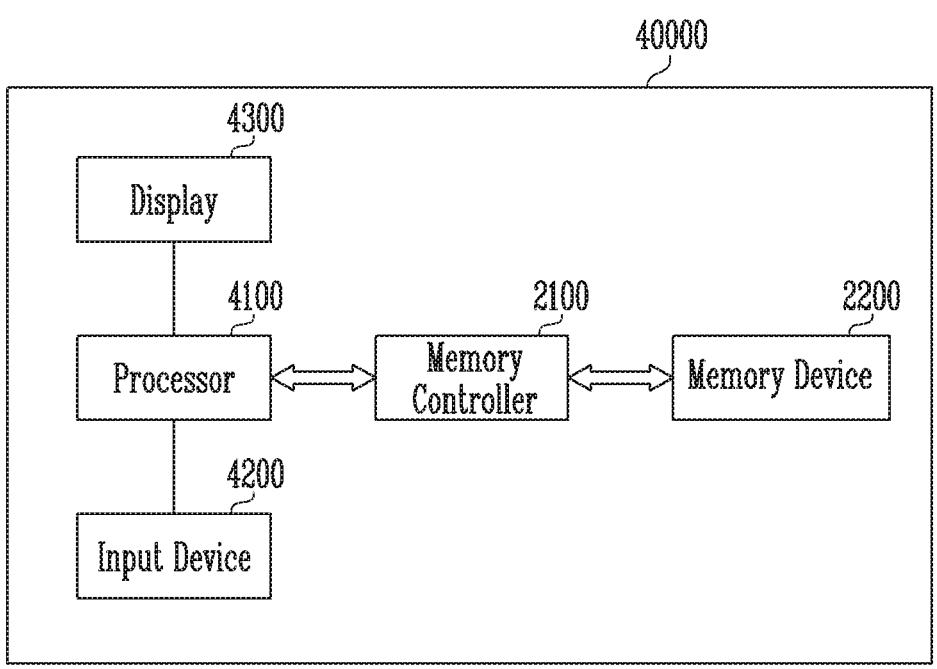

FIG. 15 is a diagram illustrating another example of a memory system including a memory controller shown in FIGS. 1 and 2.

Referring to FIG. 15, a memory system 40000 may be provided as a personal computer (PC), a tablet, a net-book, an e-reader, a personal digital assistant (PDA), a portable multimedia player (PMP), an MP3 player, or an MP4 player.

The memory system 40000 may include the memory device 2200 and the memory controller 2100 controlling the operations of the memory device 2200.

A processor 4100 may output data stored in the memory device 2200 through a display 4300 according to data input through an input device 4200. Examples of the input device 4200 may include a pointing device such as a touch pad or a computer mouse, a keypad, or a keyboard.

The processor 4100 may control the general operations of the memory system 40000 and control the operations of the memory controller 2100. In accordance with an embodiment, the memory controller 2100 capable of controlling the operations of the memory device 2200 may form a portion of the processor 4100, or may be formed as a separate chip from the processor 4100.

Figure 16:
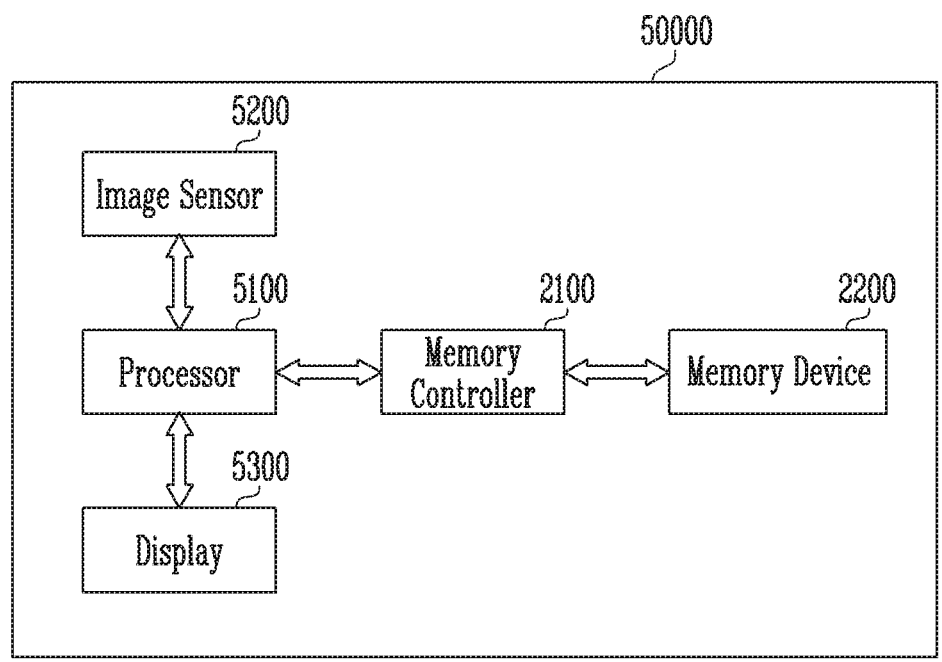

FIG. 16 is a diagram illustrating another example of a memory system including a memory controller shown in FIGS. 1 and 2.

Referring to FIG. 16, a memory system 50000 may be provided as an image processing device, for example, a digital camera, a mobile phone attached with a digital camera, a smart phone attached with a digital camera, or a tablet PC attached with a digital camera.

The memory system 50000 may include the memory device 2200 and the memory controller 2100 controlling a data processing operation of the memory device 2200, for example, a program operation, an erase operation or a read operation.

An image sensor 5200 of the memory system 50000 may convert an optical image into digital signals, and the converted digital signals may be transferred to the processor 5100 or the memory controller 2100. In response to control of the processor 5100, the converted digital signals may be output through the display 5300 or stored in the memory device 2200 through the memory controller 2100. In addition, the data stored in the memory device 2200 may be output through the display 5300 according to control of the processor 5100 or the memory controller 2100.

In accordance with an embodiment, the memory controller 2100 capable of controlling the operations of the memory device 2200 may form a portion of the processor 5100, or may be formed as a separate chip from the processor 5100.

Figure 17:
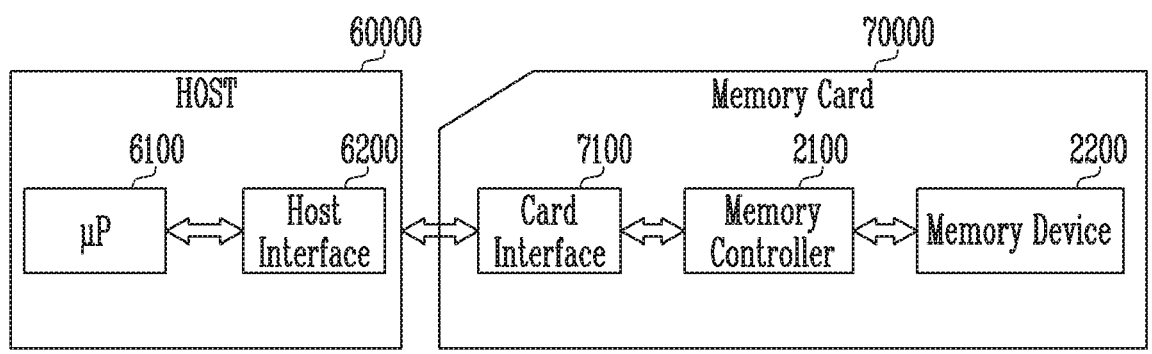

FIG. 17 is a diagram illustrating another example of a memory system including a memory controller shown in FIGS. 1 and 2.

Referring to FIG. 17, a memory system 70000 may include a memory card or a smart card. The memory system 70000 may include the memory device 2200, the memory controller 2100 and a card interface 7100.

The memory controller 2100 may control data exchange between the memory device 2200 and the card interface 7100. In accordance with embodiment, the card interface 7100 may be, but not limited to, a secure digital (SD) card interface or a multi-media card (MMC) interface.

The card interface 7100 may interface data exchange between a host 60000 and the memory controller 2100 according to a protocol of the host 60000. In accordance with an embodiment, the card interface 7100 may support a Universal Serial Bus (USB) protocol and an InterChip (IC)-USB protocol. The card interface 7100 may refer to hardware that supports a protocol used by the host 60000, software mounted on the hardware, or a signal transmission method.

When the memory system 70000 is connected to an host interface 6200 of the host 60000 such as a PC, a tablet, a digital camera, a digital audio player, a cellular phone, console video game hardware, or a digital set-top pox, the host interface 6200 may perform data communication with the memory device 2200 through the card interface 7100 and the memory controller 2100 in response to control of the microprocessor (µP) 6100.

In accordance with embodiments of the present disclosure, inverted cells in which bits are inverted in a plurality of read operations using the same read voltage may be counted, and a threshold voltage distribution may be estimated based on the number of inverted cells. In addition, an optimal read voltage may be determined based on the number of inverted cells.

While embodiments of the present invention have been illustrated and described, it will be apparent to those skilled in the art in light of the present disclosure that various modifications can be made to any of the above-described embodiments without departing from the spirit or scope of the invention. Thus, it is intended that the present invention cover all such modifications within the scope of the appended claims and their equivalents.

What is claimed is:

1. A memory controller, comprising:
a command generator generating a set of first read commands respectively corresponding to each of a plurality of read voltages having voltage levels different from each other and transferring the set to a memory device so that a first read operation is performed plural times on a plurality of memory cells for each of the read voltages; and
an inverted cell counter determining inverted cells having a change in bit values read by performing the first read operation the plural times for each read voltage on the basis of read result data received from the memory device.

2. The memory controller of claim 1, wherein the plural times is two.

3. The memory controller of claim 1, wherein the command generator generates and transfers a plurality of the first read commands for each of the read voltages, each indicating the first read operation to be performed once for the associated read voltage.

4. The memory controller of claim 1, wherein the command generator generates and transfers a single of the first read command for each of the read voltages, the first read command indicating the first read operation to be performed plural times for each of the read voltages.

5. The memory controller of claim 1, wherein each of the read result data is read data corresponding to the first read operation performed plural times for each read voltage.

6. The memory controller of claim 1, wherein the read result data indicate whether values respectively read from the memory cells are inverted during the first read operation performed plural times for each read voltage.

7. A memory controller, comprising:
a command generator generating a set of first read commands for a plurality of read voltages having voltage levels different from each other, and transferring the set to a memory device so that a first read operation is performed plural times on a plurality of memory cells for each of the read voltages;
an inverted cell counter determining inverted cells having a change in bit values read by performing the first read operation the plural times for each read voltage on the basis of read result data received from the memory device; and
an optimal read voltage determiner circuit estimating a threshold voltage distribution of the memory cells from a voltage distribution of inverted cells for each of the plurality of read voltages.

8. The memory controller of claim 7, wherein the optimal read voltage determiner circuit further determines, among the plurality of read voltages, a read voltage corresponding to a valley of the estimated threshold voltage distribution as an optimal read voltage.

9. The memory controller of claim 8, wherein the command generator generates and transfers a second read command for the optimal read voltage to the memory device so that a second read operation using the optimal read voltage is performed on the plurality of memory cells.

10. The memory controller of claim 8, further comprises:
a correction target index manager storing an index of the inverted cell corresponding to the optimal read voltage on the basis of read result data corresponding to the optimal read voltage, among read result data corresponding to the first read operations; and
an error correction code (ECC) circuit performing error correction decoding on read values, which correspond to a codeword, received from the memory device as a result of a second read operation corresponding to the optimal read voltage, and retrying the error correction decoding by changing a parameter corresponding to the inverted cell by referring the stored index when the error correction decoding fails.

11. The memory controller of claim 10, wherein the command generator further generates and transfers a second read command corresponding to the optimal read voltage to the memory device so that the second read operation corresponding to the optimal read voltage is performed on the plurality of memory cells.

12. The memory controller of claim 10, wherein the error correction decoding includes at least one of hard decision decoding or soft decision decoding.

13. The memory controller of claim 12,
wherein the hard decision decoding is error correction decoding based on at least one of a Bose Chaudhuri Hocquenghem (BCH) code, a Reed-Solomon code, a Reed-Muller code, a Low Density Parity Check (LDPC) code, and a Hamming code, and
wherein the soft decision decoding is error correction decoding based on at least one of the LDPC code and a convolution code.

14. The memory controller of claim 12, wherein the ECC circuit inverts a bit corresponding to the stored index during the hard decision decoding.

15. The memory controller of claim 12, wherein the ECC circuit changes at least one of a magnitude or a sign of a log likelihood ratio (LLR) value corresponding to the stored index during the soft decision decoding.

16. The memory controller of claim 15, wherein the ECC circuit changes at least one of a magnitude or a sign of an LLR value corresponding to an index adjacent to the stored index.

17. A memory system, comprising:
a memory device performing read operations on a plurality of memory cells; and
a memory controller suitable for:
generating and transferring two read commands for each of a plurality of read voltages having voltage levels different from each other to the memory device so that two read operations are performed on the plurality of memory cells for each of the plurality of read voltages,
receiving read data corresponding to results of the two read operations performed on each of the plurality of memory cells from the memory device,
checking whether inverted cells having a change in the read data among the plurality of memory cells by comparing the read data, and
counting checked inverted cells for each of the read voltages.

18. An operating method of a memory system, the method comprising:
performing plural times a preliminary read operation on memory cells for each of read voltages having voltage levels different from each other;
selecting one or more optimal read voltages among the read voltages based on a number of inverted cells having a change in read values detected the plural times for each of the read voltages; and
performing a primary read operation on the memory cells with the optimal read voltages.

19. The method of claim 18, further comprising:
changing, when error correction decoding fails during the primary read operation, one or more parameters of error correction decoding to retry the error correction decoding,
wherein the parameters is determined based on read values corresponding to the inverted cells among the read values.

* * * * *